(12) United States Patent
Baek

(10) Patent No.: US 6,346,440 B1
(45) Date of Patent: Feb. 12, 2002

(54) SEMICONDUCTOR MEMORY DEVICE AND METHOD FOR THE MANUFACTURE THEREOF

(75) Inventor: Yong-Ku Baek, Ichon (KR)

(73) Assignee: Hyundai Electronics Industries Co., Ltd. (KR)

( * ) Notice: Subject to any disclaimer, the term of this patent is extended or adjusted under 35 U.S.C. 154(b) by 0 days.

(21) Appl. No.: 09/607,522

(22) Filed: Jun. 28, 2000

(30) Foreign Application Priority Data

Jun. 28, 1999 (KR) .............................. 99-24999

(51) Int. Cl.[7] .................... H01L 21/8242; H01L 21/20; H01L 21/4763
(52) U.S. Cl. .................... 438/253; 438/396; 438/239; 438/622
(58) Field of Search ............................ 438/3, 253–256, 438/238–241, 381, 396–399, 622

(56) References Cited

U.S. PATENT DOCUMENTS 5,907,772 A * 5/1999 Iwasaki ...................... 438/253
6,051,858 A * 4/2000 Uchida et al. ............... 257/295
6,153,460 A * 11/2000 Ohnishi et al. .............. 438/238
6,200,855 B1 * 3/2001 Lee ............................. 438/255
6,221,713 B1 * 4/2001 Huang ......................... 438/241
6,239,022 B1 * 5/2001 Seo et al. .................... 438/629

* cited by examiner

Primary Examiner—John F. Niebling
Assistant Examiner—Viktor Simkovic
(74) Attorney, Agent, or Firm—Blakely Sokoloff Taylor & Zafman

(57) ABSTRACT

A semiconductor memory device includes an active matrix provided with a semiconductor substrate, a transistor formed on the semiconductor substrate and isolation regions for isolating the transistor, a first metal line formed on top of the active matrix and extending outside the transistor, a capacitor structure formed over the transistor and a second metal line formed on top of the capacitor structure to electrically connect the capacitor structure to the transistor through the first and the second metal lines. In the memory device, forming the capacitor structure at the position over the transistor can reduce the cell size of the memory cell.

12 Claims, 9 Drawing Sheets

SEMICONDUCTOR MEMORY DEVICE AND METHOD FOR THE MANUFACTURE THEREOF

FIELD OF THE INVENTION

The present invention relates to a semiconductor memory device; and, more particularly, to a semiconductor memory device having a compact cell size and a method for the manufacture thereof.

DESCRIPTION OF THE PRIOR ART

As is well known, a dynamic random access memory (DRAM) having a memory cell comprised of a transistor and a capacitor has a higher degree of integration mainly by down-sizing through micronization. However, there is still a demand for downsizing the area of the memory cell.

To meet the demand, therefore, there have been proposed several methods, such as a trench type or a stack type capacitor, which is arranged three-dimensionally in a memory device to reduce the cell area available to the capacitor. However, the process of manufacturing three-dimensionally arranged a capacitor is a long and tedious one and consequently involves high manufacturing cost. Therefore, there is a strong demand for a new memory device that can reduce the cell area with securing a requisite volume of information without requiring complex manufacturing steps.

In attempt to meet the demand, there have been proposed a ferroelectric memory (FeRAM) where a capacitor thin film with ferroelectric properties such as strontium bithmuth tantalate (BST) is used for capacitors in place of conventional silicon oxide film or silicon nitride film.

In FIG. 1, there is shown a cross sectional view setting forth a conventional semiconductor memory device 100 for use as FeRAM. The semiconductor memory device 100 includes an active matrix 10 incorporating a metal oxide semiconductor (MOS) transistor therein, a capacitor structure 24 having a bottom electrode, a capacitor thin film and a top electrode, a bit line 34 and a metal interconnection 36.

In FIGS. 2A to 2E, there are illustrated manufacturing steps involved in manufacturing a conventional semiconductor memory device 100 shown in FIG. 1.

The process for manufacturing the conventional semiconductor memory device 100 begins with the preparation of an active matrix 10 having a silicon substrate 2, a MOS transistor formed thereon as a selective transistor, an isolation region 4 and a first insulating layer 16 formed on the MOS transistor and the isolation region 4. The MOS transistor includes diffusion regions 6 as a source and a drain, a gate oxide 8, a spacer 14 and a gate electrode 12.

In a subsequent step, there is formed on top of the active matrix 10 a first metal layer 18, a dielectric layer 20 and a second metal layer 22, sequentially, as shown in FIG. 2A. Both of the metal layers 18, 22 are formed of titanium (Ti) and platinum (Pt) in which Ti is used for an adhesive layer. The dielectric layer 20 is made of a ferroelectric material. The first and the second metal layers 18, 22 are deposited with a sputter and the dielectric layer 20 is spin-on coated.

Thereafter, the second metal layer 22 and the dielectric layer 20 are patterned into a predetermined configuration. And then, the first metal layer 18 is patterned into a second predetermined configuration by using a photolithography method, thereby obtaining a capacitor structure 24 having a bottom electrode 18A, a capacitor thin film 20A and a top electrode 22A, as shown in FIG. 2B.

In a next step, a second insulating layer 26, e.g., made of silicon dioxide ($SiO_2$), is formed on top of the active matrix 10 and the capacitor structure 24 by using a plasma chemical vapor deposition (CVD), as shown in FIG. 2C.

In an ensuing step, openings 28, 30, 32 are formed in the second insulating layer 26 and the first insulating layer 16 of the active matrix 10 at positions over the diffusion regions 6 of the MOS transistor and the capacitor structure 24 by reactive ion etching (RIE), as shown in FIG. 2D.

Finally, a metal interconnection layer is formed over the entire surface including the interiors of the openings 28, 30, 32, and is patterned to form a bit line 34 and a metal interconnection 36, as shown in FIG. 2E.

One of the major shortcomings of the above-described semiconductor memory device 100 and the method for the manufacture thereof is that it is difficult to decrease the cell area thereof since the location of the capacitor structure 24 is not aligned with that of the MOS transistor in vertical direction.

SUMMARY OF THE INVENTION

It is, therefore, an object of the present invention to provide a semiconductor memory device having a reduced cell area by forming a capacitor structure at a position over a transistor.

It is another object of the present invention to provide a method for manufacturing a semiconductor memory device having a reduced sized by forming a capacitor structure at a position over a transistor.

In accordance with one aspect of the present invention, there is provided a semiconductor memory device, including: an active matrix provided with a semiconductor substrate, a transistor formed on the semiconductor substrate and a field oxide for isolating the transistor; a first metal line formed on top of the active matrix and extending outside the transistor; a capacitor structure formed over the transistor; and a second metal line formed on top of the capacitor structure to electrically connect the capacitor structure to the transistor through the first and the second metal line.

In accordance with another aspect of the present invention, there is provided a method for manufacturing a semiconductor memory device, the method comprising the steps of: a) preparing an active matrix provided with a semiconductor substrate and a transistor formed on top of the semiconductor substrate; b) forming a first metal layer and pattering the first metal layer into a first predetermined configuration to obtain a first metal line for electrically connecting the transistor thereto; c) forming an insulating layer on top of the first metal line; d) forming a capacitor structure at a position over the transistor; and e) forming a second metal layer and patterning into a second predetermined configuration to electrically connect the second metal line to the first metal line.

BRIEF DESCRIPTION OF THE DRAWING

The above and other objects and features of the present invention will become apparent from the following description of the preferred embodiments given in conjunction with the accompanying drawings, in which.

DETAILED DESCRIPTION OF THE PREFERRED EMBODIMENTS

Figure 1:
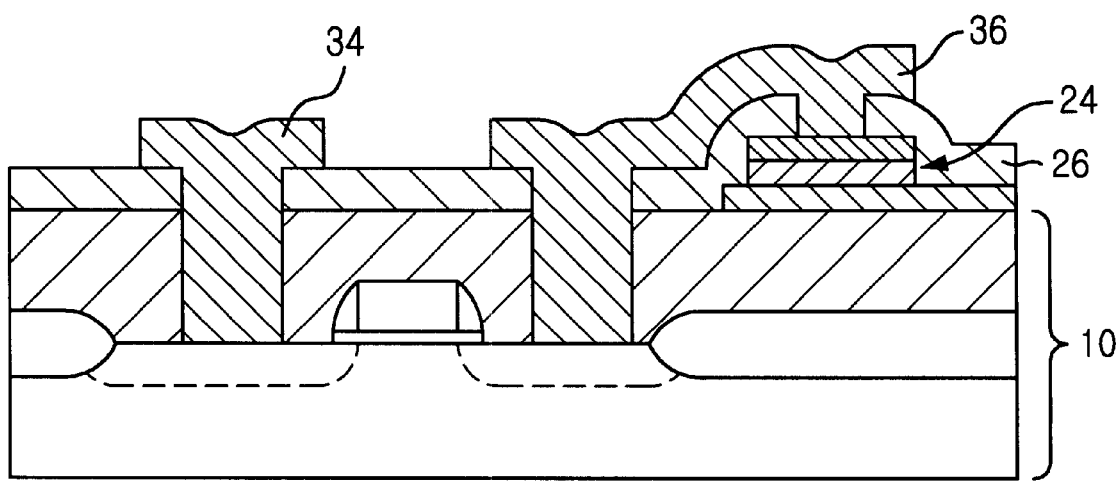
FIG. 1 shows a cross sectional view representing a prior art semiconductor memory device having a capacitor structure.
Figure 2A:
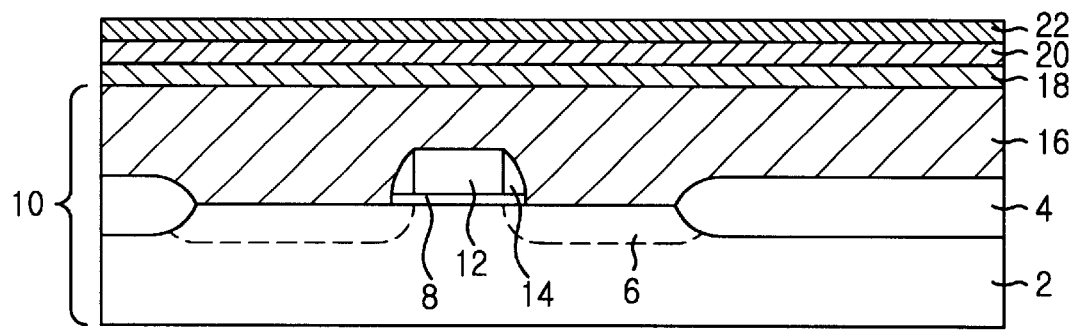
FIGS. 2A to 2E are schematic cross sectional views illustrating a prior art method for the manufacture of a semiconductor memory device.
Figure 2B:
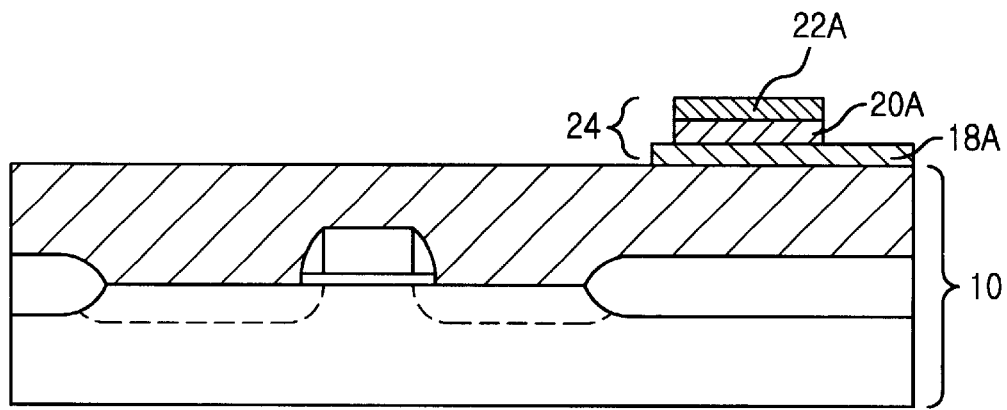
Figure 2C:
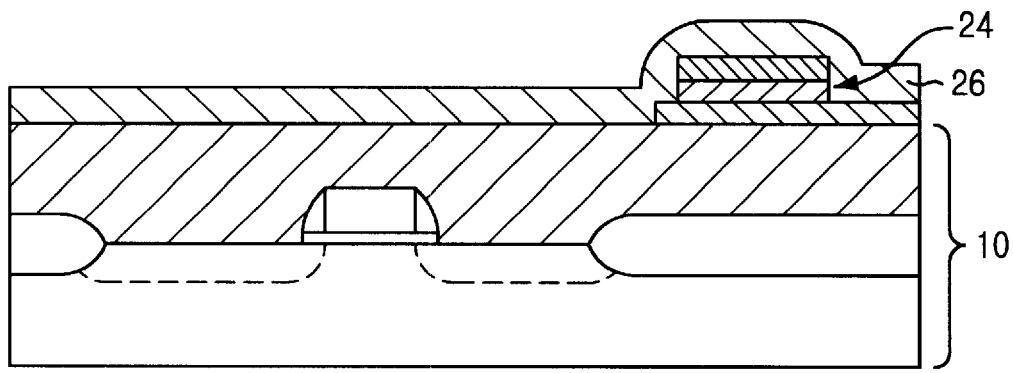
Figure 2D:
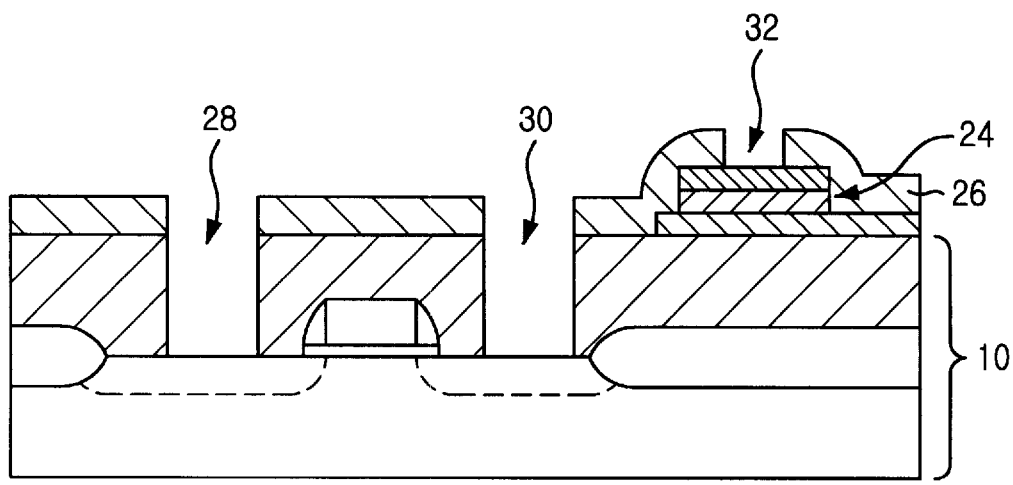
Figure 2E:
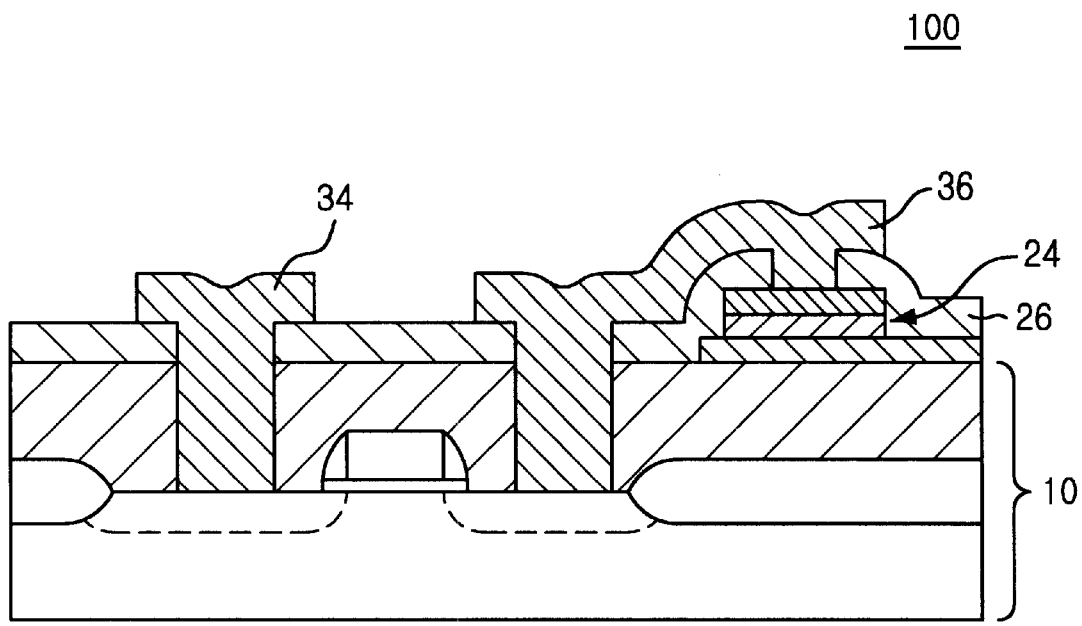

There are provided in FIGS. 3 and 4A to 4H a cross sectional view of a semiconductor memory device 200 and cross sectional views setting forth a method for the manufacture thereof in accordance with preferred embodiments of the present invention. It should be noted that like parts appearing in FIGS. 3 and 4A to 4H are represented by like reference numerals.

Figure 3:
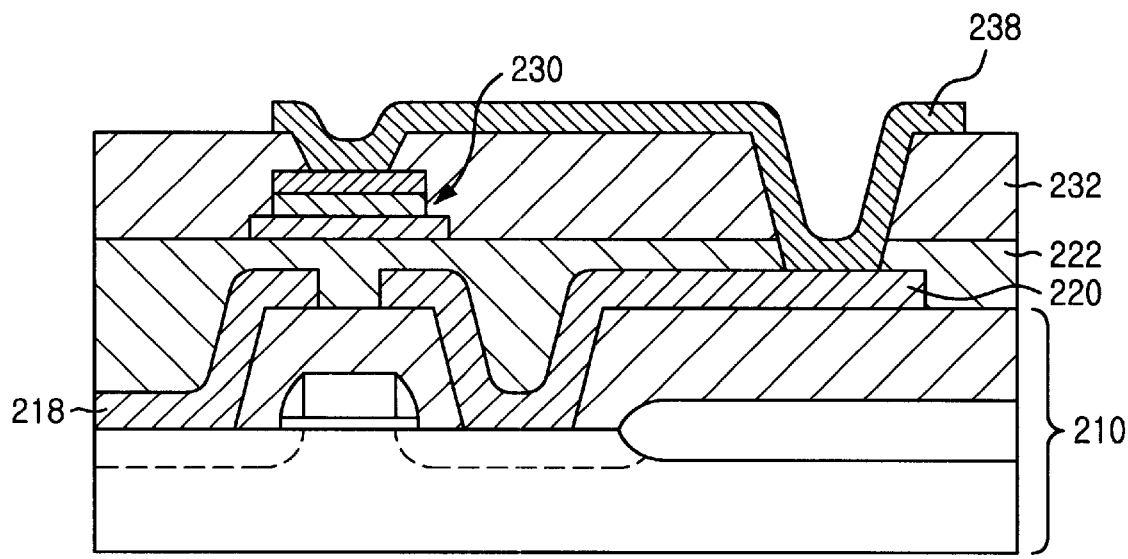
FIG. 3 is a cross sectional view setting forth a semiconductor memory device provided with a capacitor structure in accordance with the present invention.

In FIG. 3, there is provided a cross sectional view of the inventive semiconductor memory device 200 comprising an active matrix 210, a bit line 218, a leading pad 220, a capacitor structure 230 and a local interconnection line 238.

The active matrix 210 includes a semiconductor substrate 202, an isolation region 204, diffusion regions 206, a gate oxide 208, a gate line 212 formed on top of the gate oxide 208, a spacer 214 formed around the gate line 212 and a first insulating layer 216. One of the diffusion regions 206 serves as a source and the other diffusion region 206 serves as a drain. In the semiconductor memory device 200, the bit line 218 is electrically connected to one of the diffusion regions 206 and the top electrode 228A of the capacitor structure 230 is electrically connected to the other diffusion region 206 through the leading pad 220 and the local interconnection line 238, wherein the bit line 218 and the leading pad 220 are electrically disconnected each other. The bottom electrode 224A may be connected to a plate line (not shown) to apply a common constant potential thereto. Although the electrical contact between the leading pad 220 and the local interconnection line 238 occurs at a position over the isolation region 204, the electrical contact can occur at other positions provided that it gives rise to reduce the cell area of the semiconductor memory device 200. It should be understood that the present invention is not limited to the use of any specific shape of the leading pad 220 and the local interconnection line 238 provided that they give the intended electrical operation to the semiconductor memory device 200.

FIGS. 4A to 4H are schematic cross sectional views setting forth the method for manufacture of a semiconductor memory device 200 in accordance with the present invention.

The process for manufacturing the semiconductor memory device 200 begins with the preparation of an active matrix 210 including a semiconductor substrate 202, an isolation region 204, diffusion regions 206, a gate oxide 208, a gate line 212, spacers 214 and a first insulating layer 216. One of the diffusion regions 206 serves as a source and the other diffusion region 206 serves as a drain.

Figure 4A:
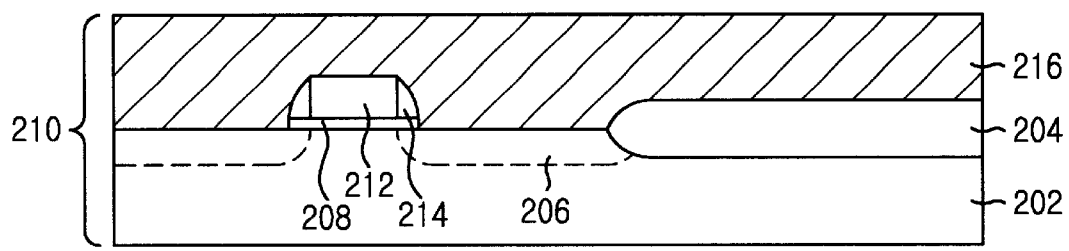
FIGS. 4A to 4H are schematic cross sectional views setting forth a method for the manufacture of the semiconductor memory device provided with the capacitor structure in accordance with the present invention.
Figure 4B:
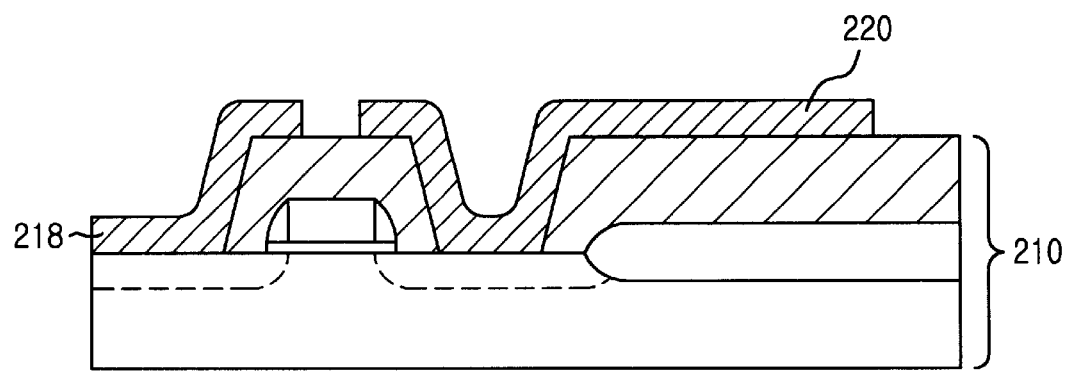

Thereafter, the first insulating layer 216, made of a material, e.g., boron-phosphor-silicate glass (BPSG), is patterned into a predetermined configuration by using a method such as a photolithography method to open top portions of the diffusion regions 206. And then, a first interconnection metal layer is formed on top of the active matrix 210 and patterned into a first predetermined configuration, thereby obtaining a bit line 218 and a leading pad 220, as shown in FIG. 4B. It should be noted that the bit line 218 and the leading pad 220 be formed during the same process. The first predetermined configuration is divided into a first shape corresponding to the bit line 218 and a second shape corresponding to the leading pad 220. The first interconnection metal layer can be made of a conducting material including, but not limited to: polysilicon doped with phosphorus (P), titanium silicide ($TiSi_2$), tungsten silicide ($WSi_2$), and the combination thereof or the like.

Figure 4C:
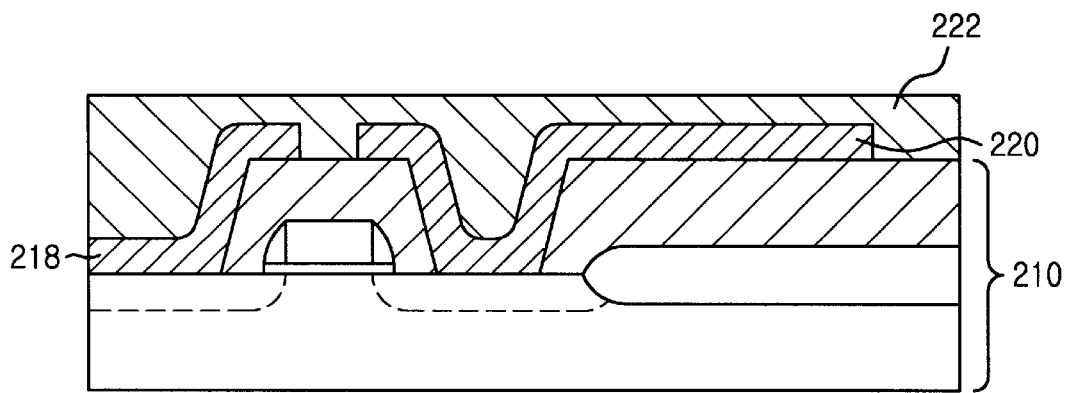

In an ensuing step, a second insulating layer 222, made of a material, e.g., BPSG, is formed on top of the bit line 218, the leading pad 220 and the active matrix 210 by using a method such as a chemical vapor deposition (CVD) and made flat by means of chemical mechanical polishing (CMP), as shown in FIG. 4C.

Figure 4D:
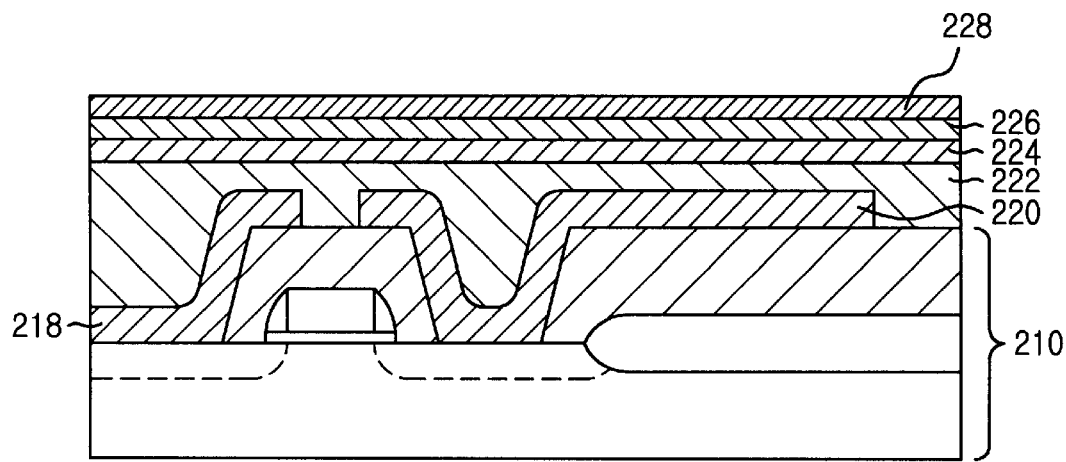

In the subsequent step, a first metal layer 224, a dielectric layer 226 and a second metal layer 228 are formed on top of the flat second insulating layer 222, subsequently, as shown in FIG. 4D. In the preferred embodiment, both of the first and the second metal layers 224, 228 can be formed of a material such as platinum (Pt), iridium (Ir), ruthenium (Ru) or the like. And also, it is possible that both of the first and the second metal layers 224, 228 can be made of a material such as $IrO_2$, $RuO_2$, LaSrCoOx or the like. The dielectric layer 226 can be made of a ferroelectric material such as SBT(SrBiTaOx), PZT(PbZrTiOx) or the like.

Figure 4E:
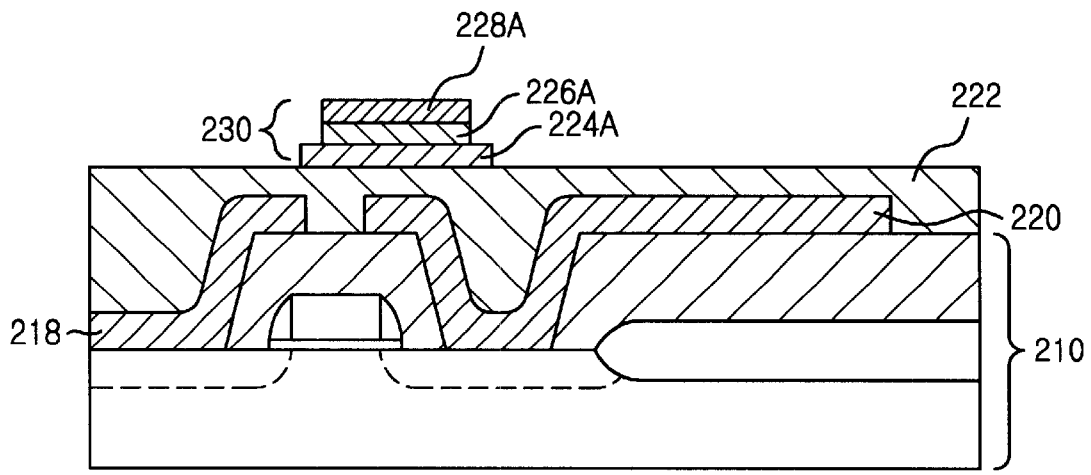

Thereafter, the second metal layer 228 and the dielectric layer 226 are patterned into a second predetermined configuration to obtain a top electrode 228A and a capacitor thin film 226A. And then, the first metal layer 224 is patterned into a third predetermined configuration to obtain a bottom electrode 224A, thereby obtaining a capacitor structure 230 having the bottom electrode 224A, a capacitor thin film 226A and a top electrode 228A, as shown in FIG. 4E. It is preferable that the size of the third predetermined configuration is larger than that of the second predetermined configuration for forming a plate line (not shown) during the following processes.

Figure 4F:
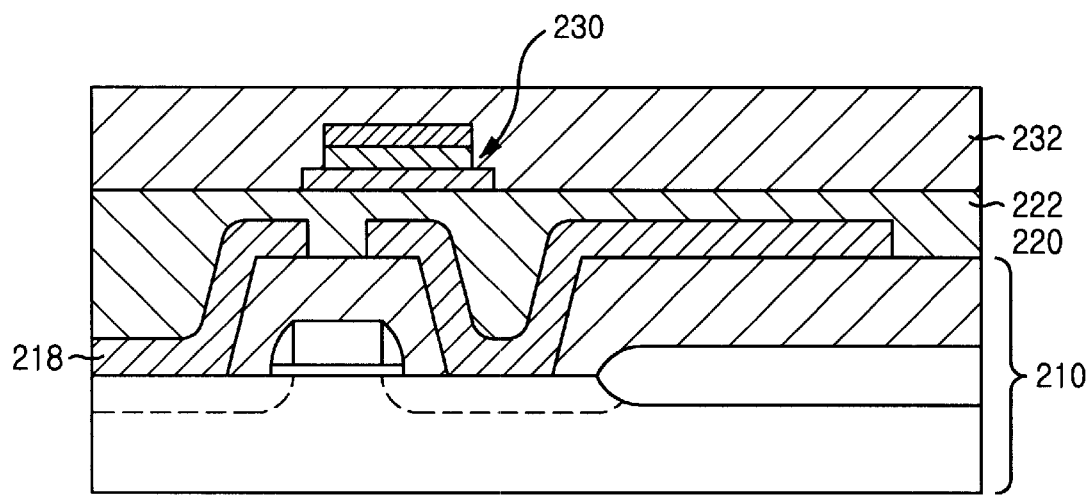

In a next step, a third insulating layer 232, e.g., made of BPSG, is formed on top of the second insulating layer 222 and the capacitor structure 230 by using a method such as a plasma CVD and made flat by using a method such as CMP, as shown in FIG. 4F. Although the semiconductor memory device 200 of FIGS. 3 and 4A to 4H are illustrated in one transistor and one capacitor structure 230, this is not intended as a limitation of the present invention. In other word, the memory device 200 may comprise, for example, two transistors and two capacitors, in which one capacitor stores data and the other capacitor structure stores the complementary value of the data.

Figure 4G:
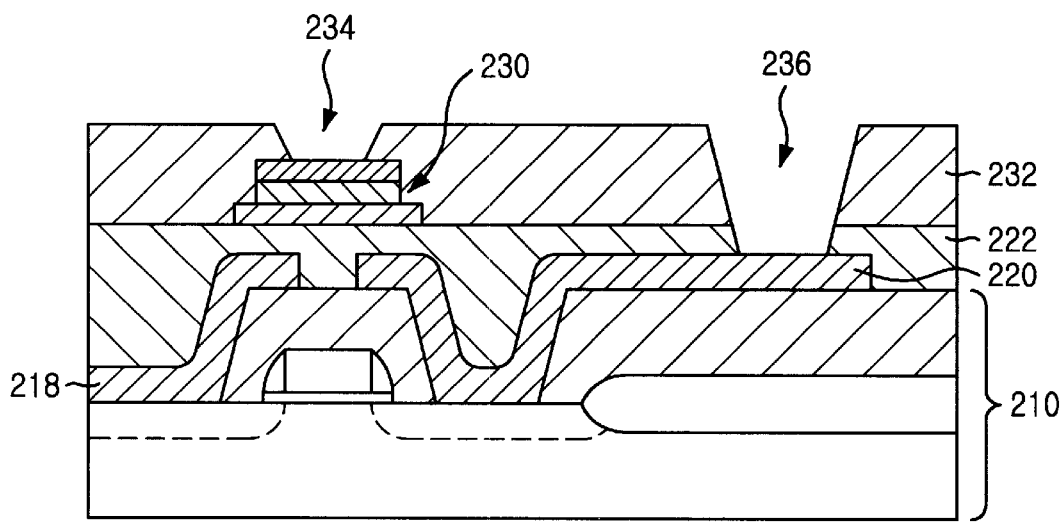

In an ensuing step, openings 234, 236 are formed in the third insulating layer 232 and the second insulating layer 222 of the active matrix 210 at positions over the capacitor structure 230 and the leading pad 220 by using a method such as a photolithography or a plasma etching, e.g., reactive ion etching (RIE), as shown in FIG. 4G.

Figure 4H:
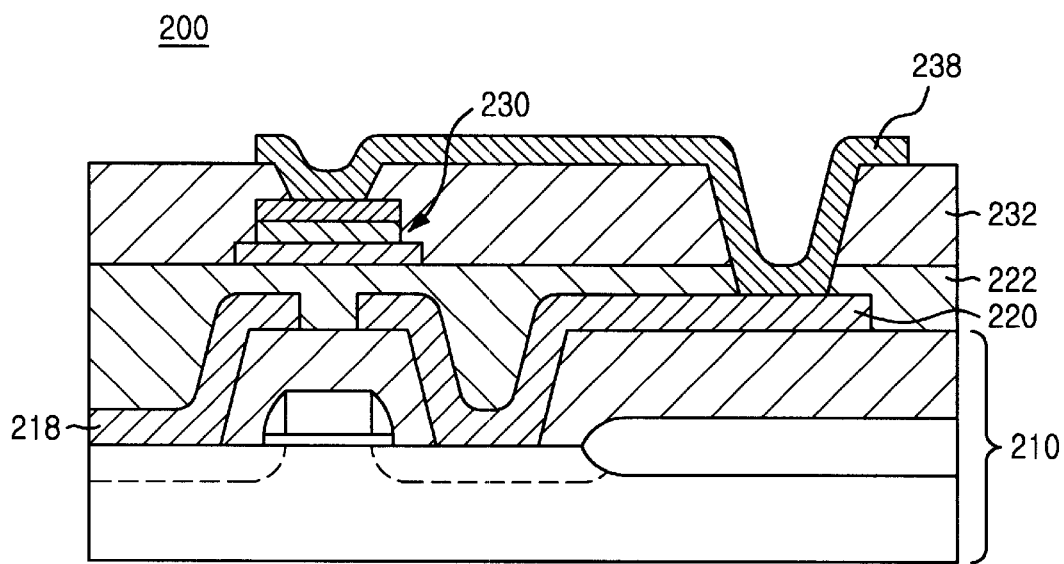

Finally, a second interconnection metal layer is formed over the entire surface including the interiors of the openings 234, 236, and is patterned into a preset configuration to form a local interconnection metal line 238, as shown in FIG. 4H. For example, the second interconnection metal layer can comprise a conductive material such as titanium nitride (TiN), polysilicon doped with phosphorus, $TiSi_2$, $WSi_2$, Pt or the like. In the figures, each of the layers is shown as that having a single layer structure for simplification.

In comparison with the prior art, the present invention can reduce the cell area of the semiconductor memory device 200 by forming the capacitor structure 230 at a position over the gate line 212. This is achieved by utilizing the leading pad 220 and the local interconnection line 238.

Further, the present invention has an advantage that it needs not an additional process for forming the leading pad 220 since it is formed during the process for forming the bit line 218.

Although the preferred embodiments of the invention have been disclosed for illustrative purposes, those skilled in the art will appreciate that various modifications, additions and substitutions are possible, without departing from the scope and spirit of the invention as disclosed in the accompanying claim.

What is claimed is:

1. A method for manufacturing a semiconductor memory device, the method comprising the steps of:
   a) preparing an active matrix provided with a semiconductor substrate, a transistor formed on top of the semiconductor substrate and a first insulating layer formed around the transistor;
   b) forming a first metal layer and pattering the first metal layer into a first predetermined configuration to obtain a first metal line for electrically connecting the transistor thereto;
   c) forming a second insulating layer on top of the first metal line;
   d) forming a capacitor structure into the second insulating layer at a position over the transistor; and
   e) forming a second metal layer and patterning the second metal layer into a second predetermined configuration to electrically connect the second metal line to the first metal line.

2. The method of claim 1, wherein the transistor includes a source region, a drain region and a gate structure.

3. The method of claim 2, wherein the capacitor structure includes a bottom electrode, a capacitor thin film and a top electrode.

4. The method of claim 3, between the steps c) and d), further comprises the step for forming a first intermediate insulating layer and making flat a top surface thereof.

5. The method of claim 13, between the steps d) and e), further comprises the step for forming a second intermediate insulating layer.

6. The method of claim 1, wherein the first predetermined configuration has a first shape corresponding to a bit line and a second shape corresponding to a leading pad, the bit line being electrically disconnected from the leading pad.

7. The method of claim 6, wherein the bit line is electrically connected to the source region and the leading pad is electrically connected to the drain region.

8. The method of claim 1, wherein the first metal layer is made of a material selected from a group consisting of polysilicon, titanium silicide ($TiSi_2$) or tungsten silicide ($WSi_2$) and the combination thereof.

9. The method of claim 3, wherein the capacitor thin film is made of a material selected from a group consisting of SBT (SrBiTaOx), PZT (PbZrTiOx).

10. The method of claim 3, wherein the top and the bottom electrodes of the capacitor structure is made of a material selected from a group consisting of platinum (Pt), iridium (Ir), ruthenium (Ru).

11. The method of claim 10, wherein the top and the bottom electrodes of the capacitor structure is made of a conductive oxide selected from a group consisting of $irO_2$, $RuO_2$, LaSrCoOx.

12. The method of claim 11, wherein the second metal layer is made of a material selected from a group consisting of platinum (Pt), titanium nitride (TiN), polysilicon doped with phosphorus (P), titanium silicide ($TiSi_2$) or tungsten silicide ($WSi_2$) and the like.

* * * * *